United States Patent [19]

Erlam

[11] Patent Number: 4,505,392
[45] Date of Patent: Mar. 19, 1985

[54] CARD FRAMES

[75] Inventor: David P. Erlam, Winchester, England

[73] Assignee: Rittal-Werk Rudolf LOH GmbH & Co., KG, Herborn, Fed. Rep. of Germany

[21] Appl. No.: 392,163

[22] Filed: Jun. 25, 1982

[30] Foreign Application Priority Data

Jun. 29, 1981 [GB] United Kingdom ............... 8119943

[51] Int. Cl.$^3$ .............................................. A47F 5/10
[52] U.S. Cl. ...................................... 211/26; 211/41; 211/189; 361/415
[58] Field of Search .................. 211/41, 26, 189, 175, 211/186, 187; 361/415; 312/350

[56] References Cited

U.S. PATENT DOCUMENTS

| 3,050,194 | 8/1962 | Sinninger | 312/350 X |
| 3,184,069 | 5/1965 | Rosenberg | 211/41 |
| 3,389,882 | 6/1968 | Schlosser | 211/175 X |
| 3,640,399 | 2/1972 | Hartman | 211/175 |
| 4,002,381 | 7/1975 | Wagner et al. | 312/183 |
| 4,184,599 | 1/1980 | Drake et al. | 211/175 X |
| 4,236,641 | 12/1980 | Marcenne | 211/26 X |

FOREIGN PATENT DOCUMENTS

| 2653468 | 6/1978 | Fed. Rep. of Germany . |
| 6703440 | 9/1967 | Netherlands . |
| 2035703 | 6/1980 | United Kingdom . |

Primary Examiner—Robert W. Gibson, Jr.
Attorney, Agent, or Firm—Maky, Renner, Otto & Boisselle

[57] ABSTRACT

A card frame for accommodating circuit cards comprises side plates (10) joined by cross rails (12). The side plates (10) are die cast and have ridges (30) integrally cast therewith, the opposed faces of the ridges acting as ledges. The ridges (30) extend in the front to rear direction of the card frame. The cross rails (12) are secured at their end to the side plates (10) by a single screw (16), twisting of the cross rails 12 being prevented by their abutting the above-mentioned ledges.

8 Claims, 2 Drawing Figures

CARD FRAMES

BACKGROUND OF THE INVENTION

1. Field of the Invention

This invention relates to card frames, and is more particularly directed to side plates thereof.

2. Description of the Prior Art

A 'card frame' (also known as a 'sub-rack') is a kind of frame structure used to house electrical circuitry mounted on 'cards' which, for example, comprise circuit boards, for instance printed circuit boards, mounting circuit components. A typical card frame comprises a pair of side plates spaced apart by generally horizontally extending cross rails. The cross rails typically mount card guides for receiving the cards together with connectors for making connections to the cards. The side plates and cross rails are of an electrically conductive material, in practice metal, and at least in some applications the conductive continuity between the cross rails and side plates should be of high quality to enhance screening and/or earth continuity. The cross rails and side plates are therefore generally secured together by screws or the like.

It is important that the cross rails be secured to the side plates in such a manner as to prevent the cross rails twisting, that is to say rotating about their longitudinal axes. (If, for example, this were not the case, the card guides or connectors could become dislodged or broken.) Some protection against twisting can be provided by securing each end of each cross rail to the associated side plate with two spaced screws instead of one. (See, for example, U.S. Pat. Nos. 3,184,069 and 4,002,381). Such a solution makes construction and assembly more complicated. In any event, it does not ensure positive location of the cross rails and side plates against twisting whereby the possibility of twisting cannot entirely be ruled out. For instance, some twisting could take place if one of the two screws were not properly tightened.

It is known from published UK Patent Application No. GB 2 035 703 A to fit a plastics moulding between each end of a cross rail and the associated side plate. The moulding has projections that, on one side, fit into a row of holes in the side plate and, on the other side, into recesses in the end of the cross rail, whereby an anti-twist mounting can be obtained with a single screw. However, the use of an extra component, namely a fairly complex plastics moulding, at each end of each cross rail increases cost and complexity. Moreover, it may in some cases detract from the quality of the conductive continuity between the cross rails and the side plates.

It is further known from published German Patent Application No. DE 2 653 468 A to provide groups of projections extending from the inside of each side plate to cooperate with recesses in the ends of the cross rails to prevent twisting of the cross rails. Assembly may be difficult since the recesses and projections must be accurately aligned. Moreover, alternative mounting positions for the rail must be spaced to such an extent that the rail will not, in one position, interfere with the projections of another group.

The side plates are often formed from steel plate, the plates having front mounting flanges which are integral with the plates or are in the form of angle members secured thereto. It is also known for the side plates to comprise aluminium extrusions. The direction of extrusion is vertically of the side plate in order that the mounting flange can be formed integrally therewith. Consequently, with such a side plate, no surface configuration extending in a generally front to rear direction can be formed since such a direction is of course transverse to the direction of extrusion.

SUMMARY OF THE INVENTION

The present invention provides a card frame comprising a pair of side plates and a plurality of cross rails secured to and extending between the side plates. In the card frame of the invention, each side plate is die cast and has a ledge cast integrally therewith and extending in a direction from the front to the rear of the side plate, at least one of the cross rails abutting said ledge where the cross rail is secured to the side plate thereby to prevent rotation of the cross rail about its longitudinal axis. In an arrangement in accordance with the invention, since the side plates are die cast it is readily possible to form a ledge extending in a generally front to rear direction in such a manner that the ledge can be used to positively locate a cross rail with respect to a side plate such that the cross rail cannot twist. Further, such a ledge can be formed even if, as is usually though not necessarily the case, the associated side plate has a front mounting flange cast integrally therewith.

The ledge need only be of sufficient length to provide an anti-twist positive location facility for the end of one cross rail. Preferably, however, as in an embodiment of the invention described hereinbelow, the ledge extends over a greater length whereby the same ledge can be used to provide an anti-twist location facility for at least two cross rails which are spaced in the front to rear direction. Further, the use of a continuous ledge of this type enables the position of at least one of a pair of cross rails spaced in the front to rear direction to be altered.

Each die cast side plate preferably has at least one integral outrigger extending rearwardly from the rear edge thereof, an extension being fitted to each said outrigger to enable a cross rail to be fitted in a position extending between the extensions. Such a facility enables a cross rail to be disposed in a more rearward position than would be the case if the extensions were not fitted, which may be a very useful feature if a standard card frame is to be adapted to house cards of an unusually large depth. To ensure that the cross rail disposed between the extension is provided with the aforementioned anti-twist facility, each said extension preferably comprises a rearward continuation of a said ledge provided on the associated side plate.

BRIEF DESCRIPTION OF THE DRAWINGS

The invention will now be further described, by way of illustrative and non-limiting example, with reference to the accompanying drawings, in which:

FIG. 2 is a like view of the right-hand end of the card frame with a portion of a side plate thereof broken away.

DETAILED DESCRIPTION

Figure 1:
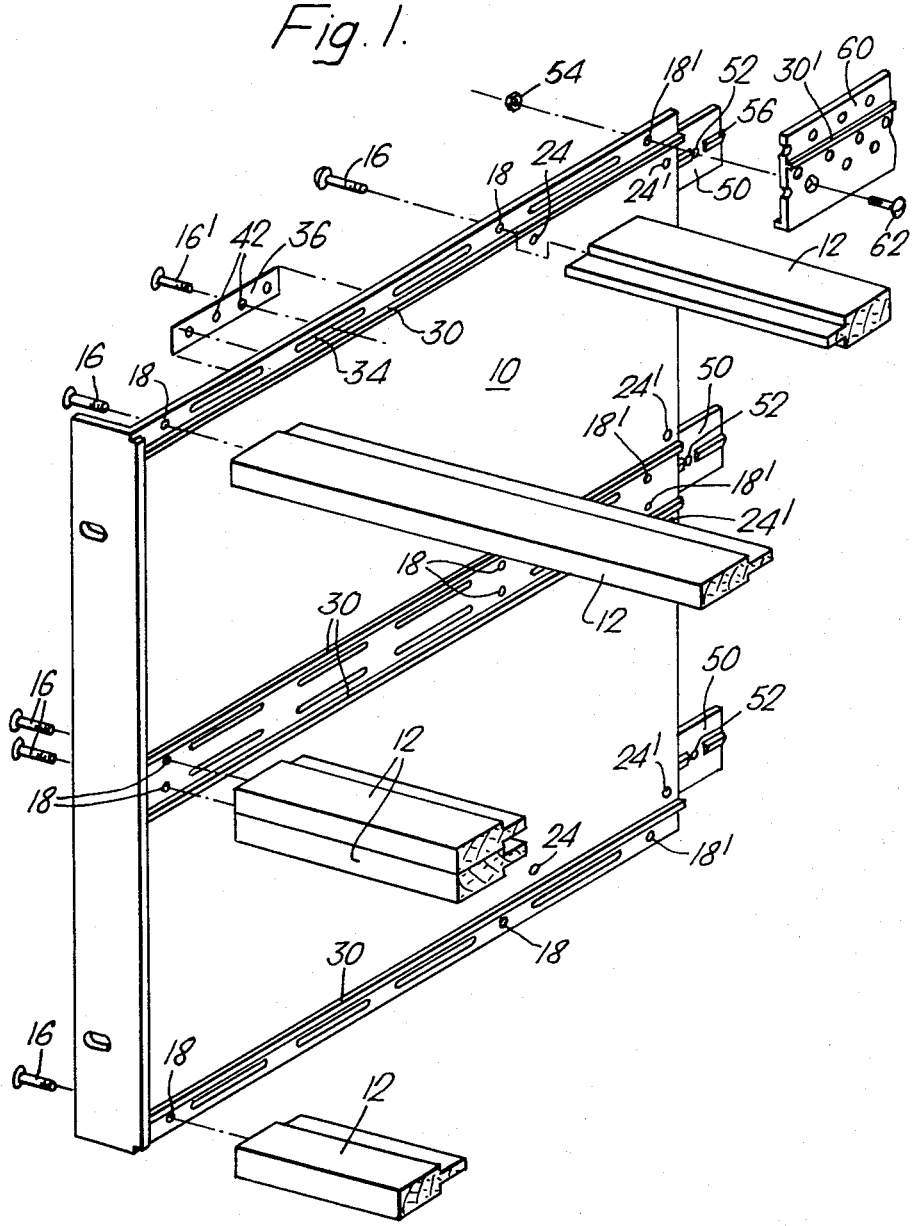
FIG. 1 is a partially exploded perspective view from the front of the left-hand end of a card frame embodying the invention.

The illustrated card frame comprises a pair of pressure die cast metal side plates 10. As shown, though this is not an essential requirement, the side plates 10 are preferably of identical construction. The side plates have front mounting flanges 11 cast integrally therewith.

The side plates 10 are disposed in respective vertical planes and are joined together and spaced apart by a plurality of horizontally extending cross rails. The cross rails comprise a first type of cross rail 12 for mounting card guides (not shown) and a second type of cross rail 14 for mounting electrical connectors (not shown) for connection to cards received in the card guides. In a manner well known to those skilled in the art, the card guides extend between front and rear pairs of the cross rails 12 to receive cards that lie in generally vertical planes and are disposed between the cross rails 12; and the connectors extend generally vertically between pairs of the cross rails 14 to make contact with inward ends of the cards. The cross rails 12 are secured to the side rails by screws 16 that extend through clearance holes 18 in the side plates 10 and into tapped holes 20 in the ends of the side rails. In like manner, the cross rails 14 are secured in place by screws 22 that extend through clearance holes 24 in the side plates 10 into tapped holes 26 in the ends of the cross rails 14.

As can best be seen from FIG. 1, on the inside thereof each side plate 10 has integrally cast therewith four ridges 30 that extend from the front towards the rear thereof. On assembly of the card frame, each end of each of the cross rails 12, 14 abuts a ledge constituted by the upper or lower surface of one of the ridges 30 whereby, even though each end of each cross rail is secured to the associated side plate by one screw only, the side rail is prevented from twisting, i.e. from rotating about its own longitudinal axis. More specifically, the upper two brackets (i.e. front and rear) cross rails 12 abut the upper surface of the top ridge 30. The next lowest front cross rail 12 and an associated rear cross rail (not shown) abut the lower surface of the second ridge 30 down. The next lowest front cross rail 12, i.e. that immediately adjacent the front cross rail 12 just mentioned, together with the associated rear cross rail (not shown), abut the upper surface of the third ridge 30 down. Finally, the lowermost front cross rail 12 and an associated rear cross rail (not shown) abut the lower surface of the bottom ridge 30.

Figure 2:
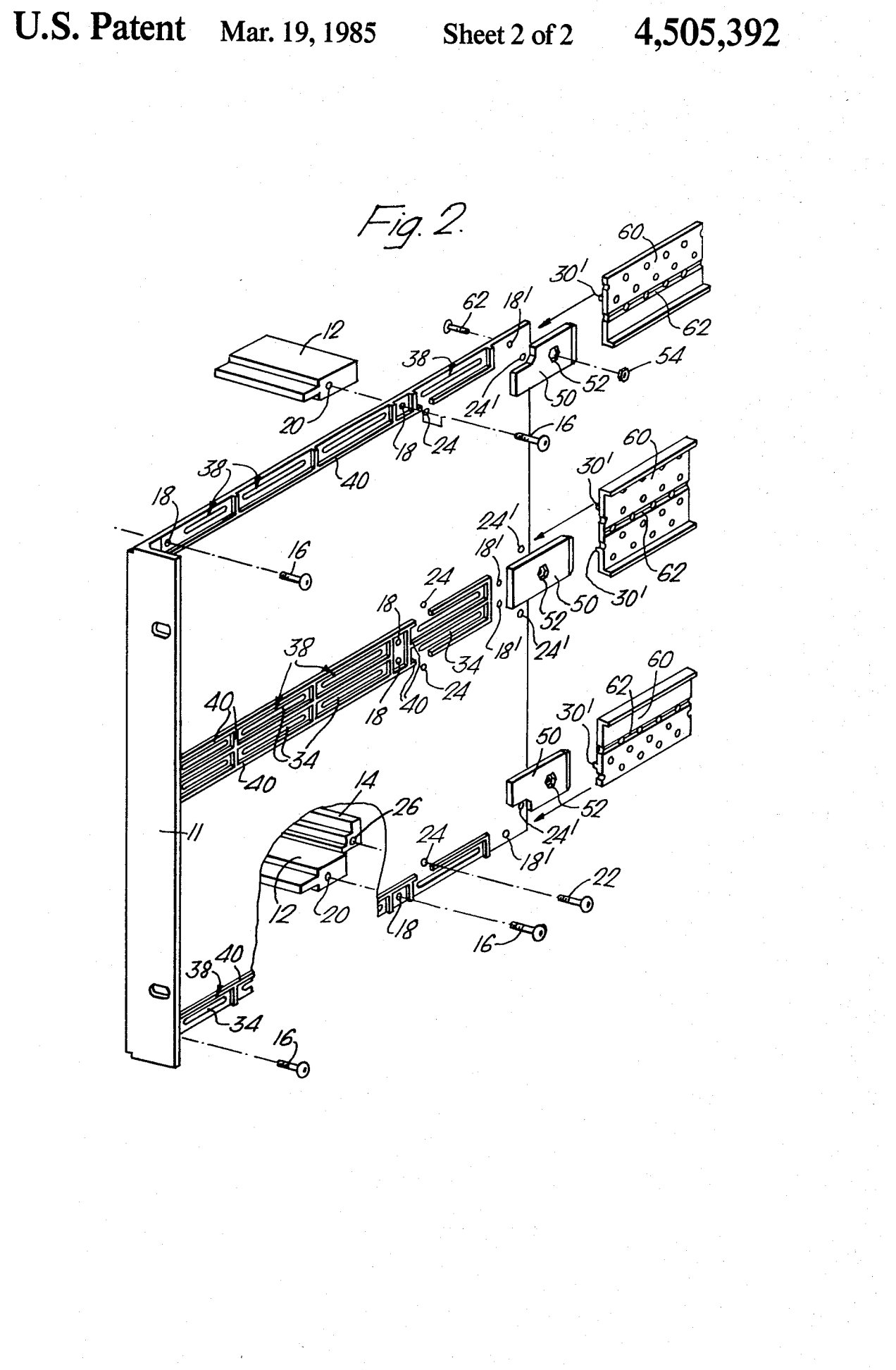

With the cross rails 12 fixed in the aforementioned positions by means of the screws 16 and holes 18, and with the cross rails 14 in corresponding positions as shown for one only of them in FIG. 2, the card frame is adapted to receive cards which are all of the same depth, i.e. a standard depth. However, provision is made in the design to receive cards of different depths, by moving at least the rearmost of the associated pairs of cross rails in either sense in the front to rear direction. For example, if the rear cross rails 12 and 14 are secured in place via holes 18' and 24', respectively, instead of via the holes 18 and 24, cards of another standard depth, greater than the above-mentioned standard depth, can be accommodated. However, the design is more versatile than this in that it also permits the accommodation of cards of a variety of other depths. In this connection, it will be observed that the side plates 10 are provided with arrays of slots 34, each array and the slots therein being aligned with lines joining the holes 18 and 18'. To secure a cross rail 12 in place in some other associated position, a screw 16' is fitted into the tapped hole 20 in the end of the cross rail 12, the screw 16' extending through a selected one of the slots 34 and also through an apertured plate 36 (FIG. 1) so dimensioned as to be received in any one of a plurality of like 'pockets' 38 formed on the exterior of the side plates 10 by virtue of further ridges 40 cast integrally with the exterior. The precise positioning of the cross rail 12 is determined by that one of the holes 42 in the associated plate 36 through which the screw 16' extends. As will be appreciated, a similar facility to that just described could be provided by removing the ridges 40 and slots 34 and providing in their place a linear array of holes whose spacing corresponds to that of the holes 42 in the plates 36 positioned in the pockets 38 aligned with the ends of the cross rails 12. However, the arrangement illustrated and described is advantageous in the case of die cast side plates where removal of the plate from the die during manufacture can be difficult if the casting includes a large number of holes.

When the cross rails 12 and therefore the cross rails 14 are not disposed at one of the two above-mentioned standard positions, the cross rails 14 can be positioned where required by drilling further holes corresponding to the holes 24, 24'.

To summarise the foregoing disclosure, the illustrated card frame is so designed that the cross rails can be fitted without difficulty in a variety of positions and in such a manner that an anti-twist facility is provided. A further feature of the illustrated card frame is that, to accommodate cards of unusually large depth, the rear cross rails can, if necessary, be extended to positions behind the side plates 10. This feature is provided in the following manner. Each of the side plates 10 has, cast integrally therewith, three outriggers 50 which extend rearwardly from the rear end thereof. Each outrigger 50 is penetrated by a hole 52, the hole 52 having a hexagonal recess at its outer end, which recess receives a nut 54. On its inner face, each outrigger 50 has an elongate protrusion 56 of triangular cross section, the protrusion 56 being interrupted at the location of the hole 52.

A respective extension 60 is secured to each of the outriggers 50 by means of the nut 54 and a screw 62. Each extension 60 has a triangular groove 62 which positively engages with the triangular protrusion 56 to relatively positively locate the outrigger 50 and the extension as the screw 62 is screwed into the nut 54. Each extension 60 comprises arrays of holes at heights corresponding to those of the holes 18 and 18' and 24, 24' whereby the rear cross rails 12 and 14 can be secured between the extensions 60 at any of a variety of desired positions. (As will be evident, and as can be seen from the drawing, the extension 60 cooperating with the outrigger 50 halfway up the height of each side plate has the above-mentioned arrays of holes duplicated since it serves to extend two sets of the holes 18, 18' and 24, 24'.)

The extensions 60 comprise ridges 30' on their inner faces, the ridges 30' serving to extend the ridges 30 whereby the anti-twist facility described above continues to be provided if the rear cross rails are mounted between the extensions 60 rather than between the side plates 10.

I claim:

1. In a card frame comprising a pair of side plates and a plurality of cross rails secured to and extending between said side plate, the improvement comprising each side plate being die cast and having a ledge cast integrally therewith and extending in a direction from the front to the rear of the side plate, at least one of said cross rails abutting said ledge where the cross rail is secured to the side plate thereby to prevent rotation of the cross rail about its longitudinal axis, at least one slot cast in each side plate in the vicinity of said ledge, and a configuration cast on the face of the side plate remote from said ledge and receiving a plate having therein a plurality of discrete holes whereby an associated cross rail can be secured to the side plate in any one of a plurality of positions by extension of a fastening element through said slot and into engagement with the cross rail via any selected one of said holes in said plate.

2. A card frame according to claim 1, wherein said ledge is of a sufficient length that at least two cross rails which are spaced in the front to rear direction can abut the ledge where they are secured to the side plate.

3. A card frame according to claim 1 or claim 2, wherein each side plate has at least one integrally cast outrigger extending rearwardly from the rear edge thereof, and an extension is fitted to each outrigger to enable a cross rail to be fitted in a position extending between said extensions.

4. A card frame according to claim 1, wherein each extension comprises a rearward continuation of a said ledge provided on the associated side plate.

5. In a card frame comprising a pair of side plates and a plurality of cross rails secured to and extending between said side plates, the improvement comprising each side plate being die cast and having a plurality of ledges cast integrally therewith and extending in a direction from the front to the rear of the side plate, each of said plurality of ledges being disposed to allow a part of a cross rail to rest thereon, at least one of said plurality of cross rails resting upon a ledge in the area where the cross rail is secured to the side plate thereby to prevent rotation of the cross rail about its longitudinal axis, at least one slot cast in each side plate in the vicinity of one of said ledges, and a configuration cast on the face of the side plate remote from said one of said ledges and receiving a plate having therein a plurality of discrete holes whereby an associated cross rail can be secured to the side plate in any one of a plurality of discrete positions by extension of a fastening element through said slot and into engagement with the cross rail via any selected one of said discrete holes in said plate.

6. A card frame according to claim 5, wherein each of said plurality of ledges is of a sufficient length that at least two cross rails which are spaced in the front to rear direction can abut the ledge where they are secured to the side plate.

7. A card frame according to claim 5, wherein each side plate has at least one integrally cast outrigger extending rearwardly from the rear edge thereof, and an extension is fitted to each outrigger to enable a cross rail to be fitted in a position extending between said extensions.

8. A card frame according to claim 7, wherein each extension comprises a rearward continuation of a ledge provided on the associated side plate.

* * * * *